United States Patent [19]

Taddiken

[11] Patent Number: 5,455,584
[45] Date of Patent: Oct. 3, 1995

[54] HIGH FREQUENCY HIGH RESOLUTION QUANTIZER

[75] Inventor: Albert H. Taddiken, McKinney, Tex.

[73] Assignee: Texas Instruments Incorporated, Dallas, Tex.

[21] Appl. No.: 241,936

[22] Filed: May 11, 1994

Related U.S. Application Data

[63] Continuation of Ser. No. 952,394, Sep. 28, 1992, abandoned.

[51] Int. Cl.$^6$ .................................................. H03M 1/12
[52] U.S. Cl. ............................................................ 341/200
[58] Field of Search ................................. 341/200, 157, 341/159, 165, 155, 156

[56] References Cited

U.S. PATENT DOCUMENTS 5,247,298  9/1993  Wei et al. ........................... 341/133

Primary Examiner—Brian K. Young
Attorney, Agent, or Firm—W. Daniel Swayze, Jr.; W. James Brady, III; Richard L. Donaldson

[57] ABSTRACT

A quantizer (20) includes a series of folding amplifiers (22) coupled by a binary weighted resistor ladder (44, 46, 48, 50). Each folding amplifier (22) includes resonant tunneling diodes (34, 36, 38, 40) to control switching of a transistor (32). The output of the folding amplifier (22), as determined by the switching state of the transistor (32), is compared to a reference voltage ($V_{REF}$) by a comparator (42). The comparator (42) determines the correct output state of the folding amplifier (22) and generates a digital output signal ($V_{o1}$) representing a bit of the digital output. The binary weighted resistor ladder successively reduces the input swing received by each folding amplifier to provide fewer and fewer switching transitions at each successive folding amplifier to create the more significant bits of the digital output.

17 Claims, 1 Drawing Sheet

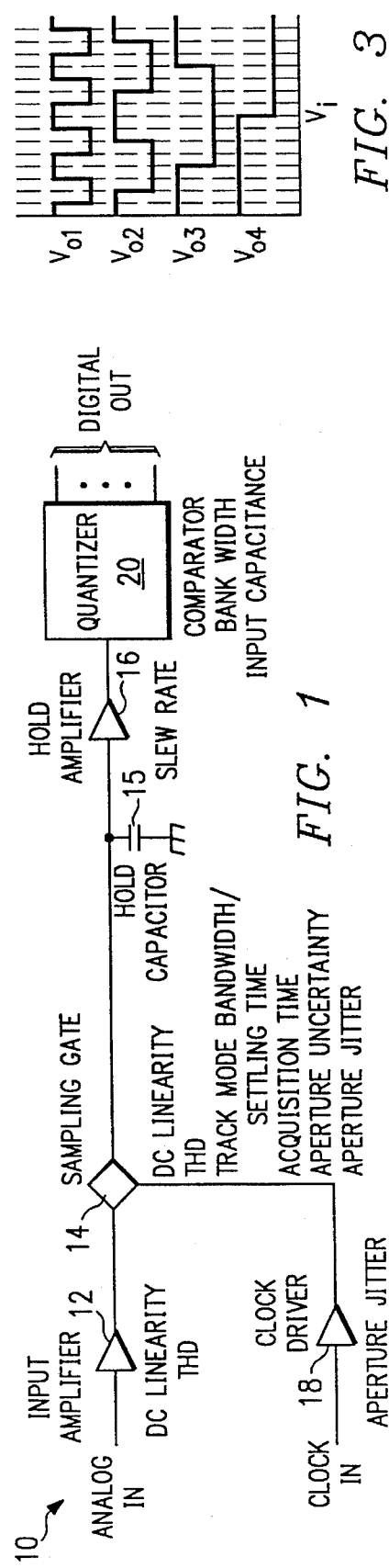
FIG. 3
FIG. 1
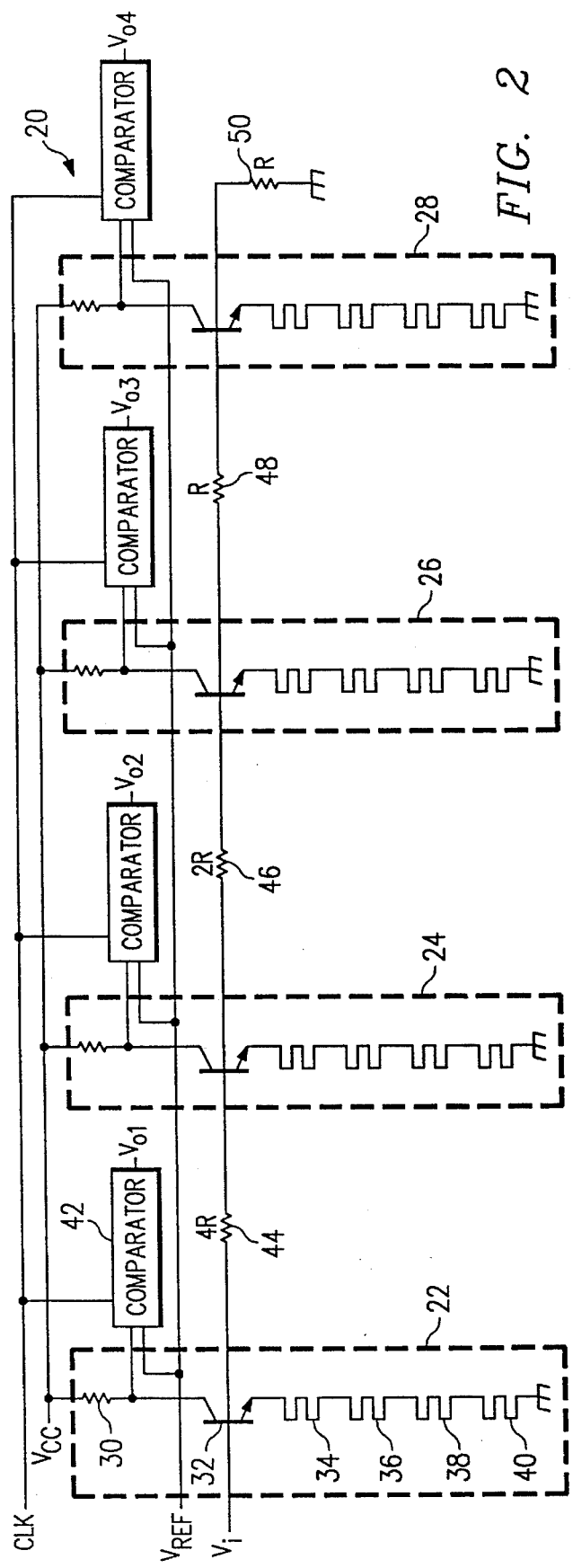
FIG. 2

HIGH FREQUENCY HIGH RESOLUTION QUANTIZER

This application is a Continuation of application Ser. No. 07/952,394, filed Sep. 28, 1992 now abandoned.

TECHNICAL FIELD OF THE INVENTION

This invention relates in general to integrated circuit devices and more particularly to a high frequency high resolution quantizer circuit.

BACKGROUND OF THE INVENTION

Conventional flash analog to digital converters receive an analog input signal through a conventional input buffer amplifier designed to drive the diode bridge of a sample and hold circuit. The sample and hold circuit includes a sampling gate and a hold amplifier that must have sufficient output source and sink currents to slew the input capacitance of a flash quantizer at the operating frequency. The quantizer contains comparators for use in decoding the analog input signal into a digital output. The number of comparators within the quantizer is approximately $2^n$, where n is the number of bits of resolution for the digital output. The hold amplifier current must slew the input capacitance of the quantizer through the full scale voltage in about one-fourth of the sampling period to allow sufficient time for comparator acquisition and decode settling. The required current from the hold amplifier scales exponentially with increasing bit resolution. The comparators are strobed with a clock line in order to produce the thermometer code that is then decoded into the digital output.

Future advanced digital phased-array radar and electronic countermeasures systems will require high frequency, high resolution analog to digital converters to capture the analog information as near to the front-end RF electronics as possible. Conventional analog to digital circuit topologies will have great difficulty in achieving 20 GHz Nyquist sampling with dynamic linearity better than about three bits for all current and projected IC technologies. The exponential increase of hold amplifier current with quantizer resolution severely limits the scalability of conventional quantizer designs. Further, transmission characteristics of the long clock lines needed to strobe the quantizer's comparator banks require that the lines be kept shorter than about one-sixteenth of a wavelength or reflections and other undesirable transmission line phenomena will make accurate phase matching of the input signal to the clock extremely difficult.

From the foregoing, it may be appreciated that a need has arisen for a quantizer that can operate under higher bandwidths and bit resolutions than prior art quantizers. A need has also arisen for a flash quantizer that does not require an exponential increase in hold amplifier current in order to increase the bit resolution of the device. Further a need has arisen for a flash quantizer which does not require long clock lines for higher bit resolutions.

SUMMARY OF THE INVENTION

In accordance with the present invention, a high frequency high resolution quantizer is provided which substantially eliminates or reduces disadvantages and problems associated with prior quantizers within conventional analog to digital converters.

The present invention includes a number of multi-level folding amplifiers that receive an analog input signal and generate corresponding digital output signals. Each amplifier corresponds to a separate bit for the desired bit resolution of the digital output. Each amplifier has a number of resonant tunneling diodes controlling the switching of transistors connected to the digital output signals. Only one comparator per digital output signal is needed to monitor the switching transitions of the transistors. The outputs of the comparators are an inverted Gray code representation of the analog input signal.

The quantizer of the present invention provides for various technical advantages over quantizers within the prior art. For example, one technical advantage is in overcoming input current and clocking limitations for increased bit resolutions. Another technical advantage is in decreasing the number of components required for quantizer operation. Other technical advantages are readily apparent to one skilled in the art from the following descriptions, figures, and claims.

BRIEF DESCRIPTION OF THE DRAWINGS

For a more complete understanding of the present invention and the advantages thereof, reference is now made to the following description taken in conjunction with the accompanying drawings, wherein like reference numerals represent like parts, in which:

FIG. 1 illustrates a block diagram of an analog to digital converter;

FIG. 2 illustrates a simplified schematic diagram of a four bit quantizer; and

FIG. 3 illustrates a graph representing the relationship of quantizer output voltages versus the analog input voltage.

DETAILED DESCRIPTION OF THE INVENTION

FIG. 1 is a block diagram of a flash analog to digital converter 10. Analog to digital converter 10 includes an input amplifier 12 that receives an analog input signal. Input amplifier 12 couples to a sample and hold circuit comprising a sampling gate 14, a hold capacitor 15, and a hold amplifier 16. A clock driver 18 couples to sampling gate 14. Hold amplifier 16 provides the analog input signal to a quantizer 20 that generates the digital output corresponding to the analog input.

In operation, analog to digital converter 10 receives an analog input signal that is buffered by input amplifier 12. Sampling gate 14 samples the analog signal at certain periodic intervals as dictated by clock driver 18. In order to reduce the effect of signal variation during conversion, the sampled analog signal from sampling gate 14 is held by hold capacitor 15 until the conversion is completed. Hold amplifier 16 provides the analog signal to a bank of comparators found within a conventional quantizer 20 that compare the analog signal to various reference signals in order to produce the digital output. However, the quantizer of the present invention requires fewer comparators than the conventional flash quantizer and only a single reference signal for producing the digital output.

FIG. 2 is a simplified schematic diagram of quantizer 20 of the present invention. Quantizer 20 comprises a series of multi-level folding amplifiers 22, 24, 26, and 28. Each folding amplifier comprises a load resistor 30, a switching element 32 shown as a bipolar transistor, and four resonant tunneling diodes 34, 36, 38, and 40. The output of each folding amplifier couples to a comparator 42 that generates the digital output signal for that amplifier. The folding amplifiers couple to one another through a binary weighted resistor ladder comprising resistors 44, 46, 48, and 50.

In operation, the first multi-level folding amplifier 22 generates the least significant bit that is compared with $V_{REF}$ in comparator 42 to produce output signal $V_{O1}$. When the comparator is in its transparent mode, the output of the folding amplifier is propagated as $V_{O1}$. In this case, as the base voltage of bipolar transistor 32 that receives the analog input signal $V_i$ is swept upward from the off state, output voltage $V_{O1}$ starts high and goes low when $V_i$ reaches $V_{be}$ plus four times the resonant tunneling diode voltage at half of the high current state of the resonant tunneling diodes. As the base voltage $V_i$ continues to increase, the resonant tunneling diodes restrict current to bipolar transistor 32 as the resonant tunneling diodes transition past the high current state through the first negative differential resistance region, switching bipolar transistor 32 off and returning output voltage $V_{O1}$ to a high state near the rail of supply voltage VCC. For further increases in base voltage $V_i$, this cycle repeats for the remaining three resonant tunneling diodes.

FIG. 3 is a graph showing the relationship between the analog input voltage $V_i$ and the output voltages $V_{O1}$, $V_{O2}$, $V_{O3}$, and $V_{O4}$. The more significant bits, $V_{O2}$, $V_{O3}$, and $V_{O4}$, are generated in a similar fashion as the least significant bit $V_{O1}$ except that the binary weighted resistor ladder causes the second folding amplifier to receive only half the input swing, the third folding amplifier receives only one-fourth the input swing, and the fourth folding amplifier receives only one-eighth the input swing, as compared with the first folding amplifier. Thus, the binary weighted resistor ladder divides analog input signal $V_i$ so that 2, 4, and 8 times the least significant bit $V_{O1}$ are required to generate the first switching transitions for $V_{O2}$, $V_{O3}$, and $V_{O4}$, respectively. The output shown in FIG. 3 is an inverted Gray code representation of the analog input. It should be appreciated that if the comparators are configured with inverting outputs, then the standard Gray code representation of the analog input will be generated.

Since the switching transitions at the collector of transistor 32 are not as abrupt as those shown in FIG. 3, one comparator per output determines the correct output state by comparison with a reference voltage $V_{ref}$. Quantizer 20 fully folds the analog input directly to a digital output and only one comparator per bit is required. This dramatically reduces the number of comparators required for a flash quantizer circuit from a factor of approximately $2^n$ found in conventional flash quantizer circuits of a factor of n of the present invention. With fewer comparators, the input capacitance of quantizer 20 is dramatically reduced allowing lower output source and sink currents from conventional hold amplifier circuits to drive quantizer 20. Further, with only one comparator per digital output required, shorter electrical lengths of the clock lines within an analog to digital converter can be used minimizing the effect of reflections and other undesirable transmission line phenomena.

Though FIG. 2 illustrates a four bit quantizer, the dynamic resolution of a multiple resonant tunneling quantizer can be extended to eight bits with the same chip size and power dissipation as a conventional three bit flash quantizer. Quantizer 20 may employ field effect transistors or bipolar transistors as the switching elements depending upon the requirements of the designer. Preferably, heterojunction switching elements are used for their high frequency operation capabilities.

The number of resonant tunneling diodes within the least significant bit folding amplifier is dependent upon the desired bit resolution for the quantizer. For the four bit quantizer 20 of FIG. 2, four resonant tunneling diodes produce the four peaks necessary for a four bit quantizer. For a three bit quantizer, only two peaks are needed for the proper output relationship and thus require two resonant tunneling diodes. The number of resonant tunneling diodes for the more significant bit folding amplifiers need only be sufficient for the number of peaks required to generate logic zero levels for their respective digital output signal. In such a case, the more significant bit folding amplifiers must be tied to a reference potential other than ground potential. However, for ease in manufacturing, each folding amplifier comprises the same number of resonant tunneling diodes. Further, though described as having four resonant tunneling diodes, each folding amplifier may have a single multiple resonant tunneling diode with four resonant peak capability.

In summary, a quantizer has a series of multi-level folding amplifiers producing a digital output from an analog input signal. Each folding amplifier corresponds to a separate bit of the digital output. Each folding amplifier uses resonant tunneling diodes for switching of a transistor connected to the analog input signal. The folding amplifiers couple to a binary weighted resistor ladder that proportionally limits the input swing of the analog input signal received by each folding amplifier to control switching of the respective transistors. The output of each folding amplifier couples to a comparator that compares the output to a reference signal in order to generate each bit of the digital output.

Thus, it is apparent that there has been provided, in accordance with the present invention, a high resolution high frequency quantizer that satisfies the objects, aims, and advantages set forth above. Although the preferred embodiment has been described in detail, it should be understood that various changes, substitutions, and alterations can be made herein. For example, many of the direct connections illustrated herein could be altered by one skilled in the art such that two components are merely coupled to one another through an intermediate component or components without being directly connected as illustrated in the preferred embodiment. As another example, the binary weighted resistor ladder may not be precisely binary weighted in order to account for finite currents required for bipolar transistor operation. Also, one skilled in the art may appreciate that the present invention may be implemented in transistor technologies other than that shown in the preferred embodiment such as field effect transistors. Other examples are readily ascertainable by one skilled in the art and could be made without departing from the spirit and scope of the present invention as defined by the following claims.

What is claimed is:

1. A quantizer of comprising:

a plurality of multi-level folding amplifiers, each of said multi-level folding amplifiers including a plurality of resonant tunneling diodes for receiving an analog input signal and generating a plurality of digital signal outputs therefrom, each amplifier corresponding to a separate digital signal output, wherein a number of said resonant tunneling diodes corresponds to a number of said digital signal outputs desired.

2. The quantizer of claim 1, wherein each amplifier includes a switching element for driving each digital signal output.

3. A quantizer of comprising:

a plurality of multi-level folding amplifiers, each of said multi-level folding amplifiers including a plurality of resonant tunneling diodes and a switching device for driving each digital signal output for receiving an analog input signal and generating a plurality of digital signal outputs therefrom, each amplifier corresponding to a separate digital signal output, wherein said switching element comprises a heterojunction bipolar transistor.

4. The quantizer of claim 2, wherein said switching element comprises a heterojunction field effect transistor.

5. The quantizer of claim 2, wherein said resonant tunneling diodes control current flow through said switching elements in response to said analog input signal.

6. The quantizer of claim 1, further comprising a binary weighted resistor ladder coupled to said amplifiers to divide the analog input signal in binary steps in order to control switching of said amplifiers.

7. The quantizer of claim 1, further comprising a comparator coupled to each amplifier's digital signal output for generating a distinct digital output signal from each folding amplifier.

8. The analog to digital converter of claim 7, wherein said digital output signals are a Gray code representation of said analog input signal.

9. A quantizer, comprising:
 a plurality of multi-level folding amplifiers for receiving an analog input signal and generating a plurality of digital signal outputs therefrom, each folding amplifier having a plurality of resonant tunneling diodes and a switching element for driving each digital signal output, each folding amplifier corresponding to a separate digital signal output, each digital signal output corresponding to a bit position of a digital representation of said analog input signal; and
 a binary weighted resistor ladder coupled to said folding amplifiers to separately control switching of said folding amplifiers by providing a different level of said analog input signal to each folding amplifier in order to define said bit positions.

10. The quantizer of claim 9, wherein a number of said resonant tunneling diodes corresponds to a number of said digital signal outputs desired.

11. The quantizer of claim 9, wherein said switching element comprises a heterojunction bipolar transistor.

12. The quantizer of claim 9, wherein said switching element comprises a heterojunction field effect transistor.

13. The quantizer of claim 9, further comprising a comparator coupled to each folding amplifier's digital signal output for generating a distinct digital output signal from each folding amplifier corresponding to said bit positions.

14. An analog to digital converter, comprising:
 a quantizer having a plurality of multi-level folding amplifiers for receiving an analog input signal and generating a plurality of digital signal outputs therefrom, each folding amplifier corresponding to a separate digital signal output, each folding amplifier having a plurality of resonant tunneling diodes and a switching element for driving each digital signal output, said quantizer having a binary weighted resistor ladder coupled to said folding amplifiers to separately control switching of said folding amplifiers.

15. The analog to digital converter of claim 14, further comprising a comparator coupled to each folding amplifier's digital signal output for generating a distinct digital output signal from each folding amplifier.

16. The analog to digital converter of claim 15, wherein a number of said resonant tunneling diodes corresponds to a number of said digital signal outputs desired.

17. The analog to digital converter of claim 16, wherein said digital output signals are a Gray code representation of said analog input signal.

* * * * *